US010872996B2

(12) United States Patent
He et al.

(10) Patent No.: US 10,872,996 B2
(45) Date of Patent: Dec. 22, 2020

(54) SEMICONDUCTOR DEVICE AND METHOD OF FORMING THE SAME

(71) Applicant: The Hong Kong University of Science and Technology, Hong Kong (CN)

(72) Inventors: Qinglin He, Los Angeles, CA (US); Ying Hoi Lai, Hong Kong (CN); Yi Liu, Hong Kong (CN); Iam Keong Sou, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 16/265,246

(22) Filed: Feb. 1, 2019

(65) Prior Publication Data

US 2019/0165199 A1 May 30, 2019

Related U.S. Application Data

(62) Division of application No. 15/741,783, filed as application No. PCT/CN2016/088756 on Jul. 6, 2016, now abandoned.

(Continued)

(51) Int. Cl.
| | |
|---|---|
| *H01L 31/108* | (2006.01) |
| *H01L 31/18* | (2006.01) |
| *H01L 31/032* | (2006.01) |
| *H01L 31/0224* | (2006.01) |
| *H01L 31/036* | (2006.01) |
| *H01L 21/02* | (2006.01) |

(Continued)

(52) U.S. Cl.
CPC ........... *H01L 31/108* (2013.01); *H01L 22/26* (2013.01); *H01L 29/22* (2013.01); *H01L 29/267* (2013.01); *H01L 31/00* (2013.01); *H01L 31/022408* (2013.01); *H01L 31/022491* (2013.01); *H01L 31/036* (2013.01); *H01L 31/0328* (2013.01); *H01L 31/0336* (2013.01); *H01L 31/18* (2013.01); *H01L 21/0259* (2013.01); *H01L 21/02395* (2013.01); *H01L 21/02568* (2013.01); *H01L 21/02631* (2013.01); *H01L 29/122* (2013.01); *H01L 31/032* (2013.01); *H01L 31/0304* (2013.01)

(58) Field of Classification Search
CPC .................................................. H01L 31/108
See application file for complete search history.

(56) References Cited

U.S. PATENT DOCUMENTS

| | | | | |
|---|---|---|---|---|
| 2002/0037461 | A1* | 3/2002 | Van Der Werf | .... G03F 7/70558 430/30 |
| 2004/0032203 | A1* | 2/2004 | Mikami | ................. H05B 33/26 313/502 |

(Continued)

*Primary Examiner* — Omar F Mojaddedi
(74) *Attorney, Agent, or Firm* — Osha Bergman Watanabe & Burton LLP

(57) ABSTRACT

A UV radiation detector includes: a diode including a substrate having a first side and a second side, the first side and the second side being located on opposing faces of the substrate, an active layer including rocksalt phase crystalline structure CaS disposed on the first side of the substrate, an electrical contact disposed on the second side of the substrate, and a semi-transparent conducting layer disposed on the active layer; and a circuit connecting the semi-transparent conducting layer and the electrical contact. The UV radiation detector detects radiation having a wavelength between 200 and 280 nm.

5 Claims, 7 Drawing Sheets

Related U.S. Application Data

(60) Provisional application No. 62/231,449, filed on Jul. 6, 2015.

(51) Int. Cl.
    *H01L 29/872*     (2006.01)
    *H01L 29/78*     (2006.01)
    *H01L 29/267*     (2006.01)
    *H01L 29/22*     (2006.01)
    *H01L 31/0328*     (2006.01)
    *H01L 21/66*     (2006.01)
    *H01L 31/0336*     (2006.01)
    *H01L 31/00*     (2006.01)
    *H01L 29/12*     (2006.01)
    *H01L 31/0304*     (2006.01)

(56) References Cited

U.S. PATENT DOCUMENTS

2006/0220031 A1\* 10/2006 Krames et al. ......... H01L 33/30
    257/43
2007/0200112 A1\* 8/2007 Yamazaki et al. ..........................
    H01L 51/5278
    257/79
2012/0261658 A1\* 10/2012 Akasaka et al. ...... H01L 31/108
    257/449
2012/0306042 A1\* 12/2012 Sou et al. ............. H01L 31/108
    257/72

\* cited by examiner

SEMICONDUCTOR DEVICE AND METHOD OF FORMING THE SAME

CROSS-REFERENCE TO RELATED APPLICATIONS

This is a divisional application of U.S. patent application Ser. No. 15/741,783, filed on Jan. 4, 2018. This application claims priority to international application No. PCT/CN2016/088756, filed on Jul. 6, 2016, and U.S. Provisional Patent Application No. 62/231,449, filed Jul. 6, 2015, the entirety of which are hereby expressly incorporated by reference herein.

BACKGROUND OF INVENTION

Ultraviolet (UV) photodetectors working in solar-blind spectrum ranging from 220 to 280 nm with very high sensitivity are of importance, for versatile applications, such as flame detection, missile plume sensing, chemical/biological agents detection, air and water purification, and space-to-space communications. Such photodetectors may be a part of multi-sensor systems employed to monitor areas or structures. These multi-sensor systems are usually equipped to minimize adverse impacts due to climate, pollution, theft, vandalism, insects, mold and fire. Because of the speed and totality of the destructive forces of fire, it constitutes one of the more serious threats. Thus, fire detection may be one of the most important issues in today's building design.

The most commonly used fire detector in fire safety sector is the smoke detector. However, smoke detectors often have a high false alarm rate. Some estimates have the ratios of false to actual alarms at 11 to 1. Smoke detectors may also suffer from their slow response in a large monitoring area because the detector may not be activated until the smoke generated from the fire source reaches the detector. Smoke detectors may also be unsuitable for fire detection devices in car parks, since the products of combustion produced by exhaust fumes from a vehicle could cause a smoke detector to operate and produce an unwanted alarm.

Able to compensate for some of the above disadvantages of smoke detectors, flame detectors have recently attracted much research and development attention. Flame detectors use optical sensors working at specific spectral ranges to record the incoming radiation at the selected wavelengths. The signals are then analyzed using a predetermined technique (such as flickering frequency, threshold energy signal comparison, mathematical correlation between several signals, and correlation to memorized spectral analysis). Flame detectors are available in a number of sensor types. The most common including UV detectors or ultraviolet/infrared (UV/IR) detectors. UV only flame detectors work with wavelengths shorter than 300 nm (i.e., the solar blind spectral band). They detect flames at high speed (3-4 milliseconds) due to the UV high-energy radiation emitted by fires and explosions at the instant of their ignition, UV/IR detectors compare the threshold signal in two spectral ranges and their ratio to each other to confirm the reliability of the fire signal, thus minimizing false alarms.

SUMMARY OF INVENTION

In one aspect, embodiments of the technology disclosed herein include a diode with a substrate having a first side and a second side, the first side and the second side being located on opposing faces of the substrate. The diode also includes an active layer having a rocksalt phase crystalline structure of CaS disposed on the first side of the substrate, and an electrical contact disposed on the second side of the substrate. The diode also includes a semi-transparent conducting layer disposed on the active layer.

In another aspect, embodiments of the technology disclosed herein include a UV radiation detector that includes a diode. The diode includes a substrate having a first side and a second side, the first side and the second side being located on opposing faces of the substrate. The diode also includes an active layer of a rocksalt phase crystalline structure of CaS disposed on the first side of the substrate, and an electrical contact disposed on the second side of the substrate. The diode includes a semi-transparent conducting layer disposed on the active layer, and a circuit connecting the semi-transparent conducting layer and the electrical contact. The UV radiation detector detects radiation having a wavelength between 220 and 280 nm.

In another aspect of the embodiments of the technology disclosed herein, a method of manufacturing semiconductor device includes growing a binary molecular precursor layer on a substrate. In the growth process, the substrate is heated to a first temperature, then molecular beam epitaxy is conducted on one side of the substrate. The temperature of the substrate is then ramped at a first rate to a second temperature while under the flux of the molecular beam epitaxy. The temperature of the substrate is held at the second temperature for a first period of time while under the flux of the molecular beam epitaxy and, then, the temperature of the substrate is reduced at a second rate to a third temperature while under the flux of the molecular beam epitaxy. The method includes growing a second layer formed of the same binary molecular material as the precursor layer, on the binary molecular precursor layer for a second period of time to form an active layer that includes the first layer and second layer. The substrate has a lattice mismatch between 0.47% and 12.6% with respect to the active layer.

Other aspects and advantages of the invention will be apparent from the following description and the appended claims.

DETAILED DESCRIPTION

Figure 1:
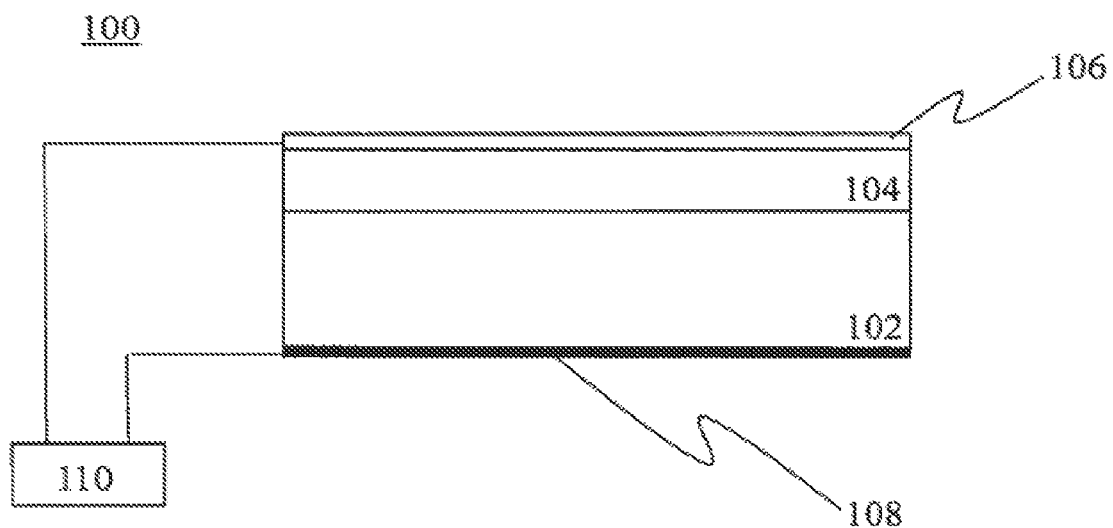
FIG. 1 is a schematic in accordance with one or more embodiments of the invention.

Embodiments of the invention will now be described in detail with reference to the accompanying figures. Like elements in the various figures may be denoted by like reference numerals for consistency. Further, in the following detailed description of embodiments of the present invention, numerous specific details are set forth in order to provide a more thorough understanding of the claimed subject matter. However, it will be apparent to one of ordinary skill in the art that the embodiments disclosed herein may be practiced without these specific details. In other instances, well-known features have not been described in detail to avoid unnecessarily complicating die description.

In general, embodiments of the invention relate to a method of fabricating a binary compound rocksalt phase crystalline layer. More specifically, embodiments of the invention relate to a Schottky-barrier diode and method of manufacturing such a Schottky-barrier diode using a thin binary compound rocksalt phase crystalline layer as an active material. Moreover, embodiments of the invention relate to a solar blind UV detector that includes a Schottky-barrier diode using a thin binary compound rocksalt phase crystalline layer as an active material.

One or more embodiments of the invention use the binary compound material calcium sulfide (CaS) as a rocksalt phase crystalline layer as an active material in a Schottky-barrier diode. Such Schottky-barrier diodes may be used as UV solar blind detectors. The photoresponse spectra of a CaS based diode may remain almost identical even for a large-scale production, without being affected by the consumption of the stored sources in the growth system. Additionally, CaS is considered an environment friendly material.

Embodiments of the CaS UV solar blind detector may be operated in a zero-bias mode without the need of an external power supply. As will be discussed below, embodiments of the CaS UV solar blind detector may have a sharp cutoff at 235 nm with a visible rejection of over 5 orders. In addition, embodiments of the CaS UV solar blind detector may have an external quantum efficiency as high as 19%, as explained below.

In addition, CaS only slightly reacts with water vapor in air. Therefore, embodiments of the CaS active layer show no detectable deterioration within a week. Such advantages provide enough time for handling the downstream microelectronic processing.

Embodiments disclosed herein may also use the binary compound material calcium telluride (CaTe) as a rocksalt phase crystalline layer as the material in the active layer. A high crystalline quality CaTe thin film may have important applications as a buffer layer for the growth of rocksalt tin telluride (SnTe) and lead-tin-telluride ($Pb_{1-x}Sn_xTe$) thin films and related nano-structures. Such nano-structures have been demonstrated to be a class of exotic materials referred to topological crystalline insulators. In accordance with embodiments disclosed herein, the methods disclosed below may be successfully applied to the fabrication of CaTe/SnTe/CaTe quantum well structures. SnTe is known to have a lattice constant of 6.33 Å. Therefore, such quantum well structures have a small lattice mismatch of only 0.47% between the CaTe and SnTe layers.

FIG. 1 is a schematic of a Schottky-barrier diode device in accordance with one or more embodiments of the invention. The diode device 100 includes a substrate 102, an active layer 104 formed on a first side of the substrate, and a semi-transparent conducting layer 106 formed on the active layer. The diode device 100 may also include an electrical contact 108 formed on a second side of the substrate, the second side being the opposite face of the first side of the substrate 102, that is electrically connected to the semi-transparent conducting layer 106 via a circuit 110.

Embodiments of the active layer 104 include a binary compound rocksalt phase crystalline layer manufactured as described in FIG. 2 below. For example, the binary compound material may be CaS or CaTe. The direct band gap of CaS has been reported to be as large as ~5.38 eV, which overlaps the desired spectral range for solar blind UV flame detection. The binary compound material in the embodiments of the active layer 104 is manufactured using a molecular beam epitaxy (MBE) system, as explained below with reference to FIG. 2.

In one or more embodiments, a gallium arsenide (GaAs) based substrate may be as the substrate 102. For example, a $n^+$-GaAs (100) substrate, such as a zinc-blend GaAs (100), may be used. Other orientations such as (111)B and (110) may also be used. A zinc-blend GaAs (100) substrate has a lattice constant of 5.65 Å which has a low misfit in lattice constant with rocksalt phase CaS (~0.7%) and CaTe (12.6%). CaS is known to crystallize in a rocksalt structure with a lattice constant of 5.69 Å, while CaTe is known to crystallize in a rocksalt structure with a lattice constant of 6.36 Å.

The use of GaAs substrates may be advantageous in large scale manufacturing of the embodiments of the CaS based UV solar blind detectors. The bonding nature of GaAs is known to be dominantly covalent-type, while CaS is typical of ionic bonding. Although the two materials possess the same face-centered cubic symmetry with closely matched lattice constants, there is a fundamental difference in bonding configurations for the ionic and covalent-type bonding. Thus, conventional hetero-epitaxial growth may induce the self-organization of CaS islands or dots on the surface of the GaAs substrate. Embodiments discussed herein advantageously overcome such considerations by providing a multi-step method to control the deposition of the binary compound rocksalt phase crystalline layer.

Embodiments of the semi-transparent conducting layer 106 include a relatively thin metallic layer. For example, the semi-transparent conducting layer 106 may be a gold (Au) film with thickness around 10 nm. Other metallic thin films such as platinum (Ft) or palladium (Pd) may also be used. The semi-transparent conducting layer 106 may be fabricated by either sputtering or e-beam evaporation techniques in accordance with embodiments disclosed herein.

Embodiments of the electrical contact 108 include ohmic contacts as known in the art. The electrical contact 108 may take the form of a contact point, strip or an additional layer. In embodiments disclosed herein, the electrical contact 108 is an additional layer so that the photo-current may be collected more evenly. For example, the electrical contact 108 may be a molten gallium layer disposed on the hack side of the GaAs substrates as known in the art.

Figure 2:
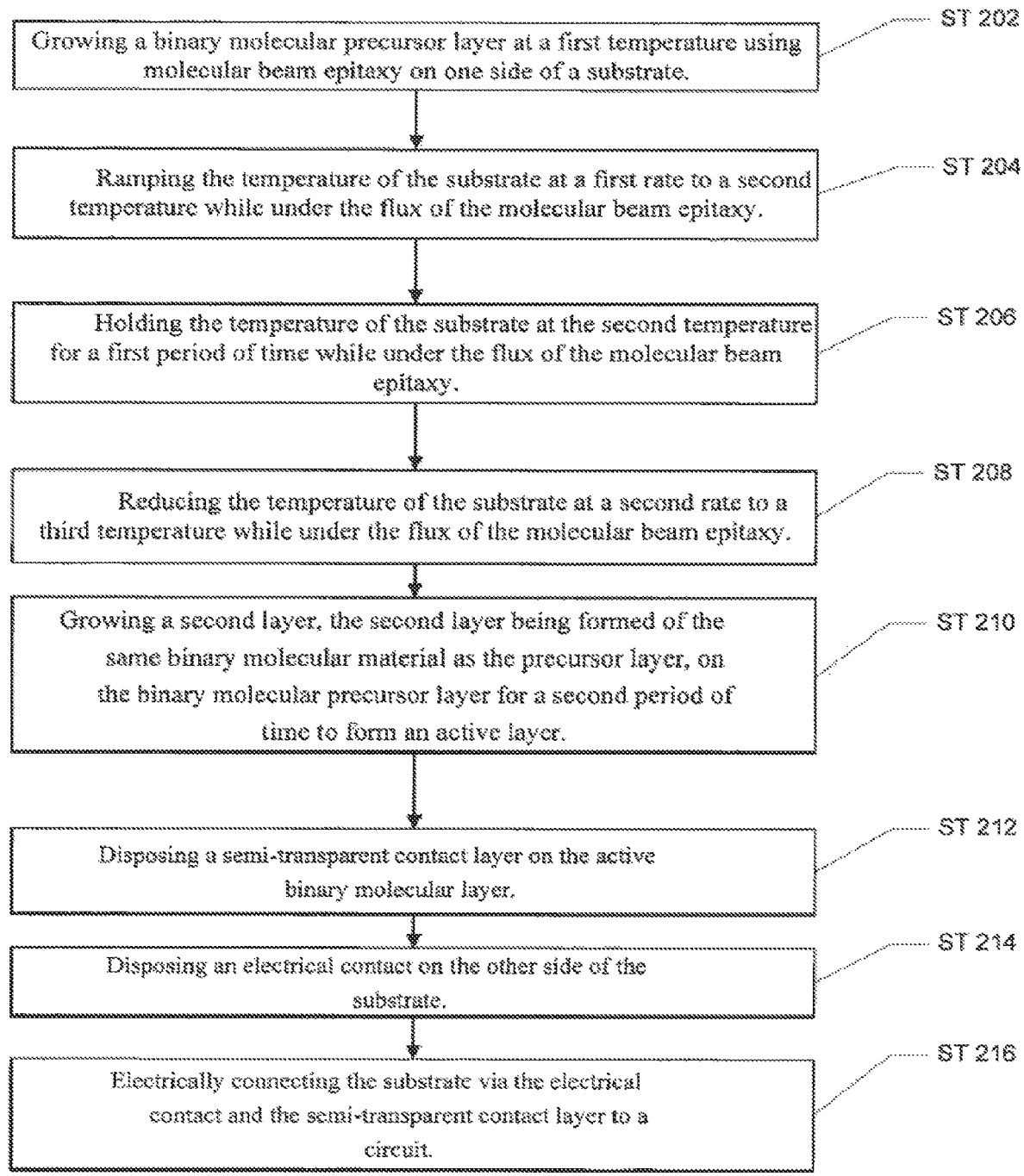
FIG. 2 is a flow chart in accordance with one or more embodiments of the invention.

FIG. 2 is a flow chart in accordance with one or more embodiments of the invention. FIG. 2 describes a method of disposing the active layer 104 onto the substrate 102 in accordance with embodiments discussed herein.

Embodiments of the circuit 110 include the necessary electronics to monitor and operate the Schottky-barrier diode device as known in the art.

In ST 202, a binary molecular precursor layer is grown at a first temperature using molecular beam epitaxy (MBE) on one side of the substrate. For example, the substrate may be a $n^+$-GaAs (100) substrate as described above. In embodiments disclosed herein, the growth process and crystalline quality may be monitored in-situ using reflection high energy electron diffraction (RHEED) (not shown). The resulting RHEED patterns at this stage were blurry and faint, dim offline dots and ear a may also be observed.

In the examples provided herein, the MBE was performed using a VG V80H molecular beam epitaxy system. For the embodiments using CaS, an elemental Ca source and a compound ZnS source is used to provide the required Ca and S, respectively. For the embodiments using CaTe, an elemental Ca source and an elemental Te source is used to provide the required Ca and Te respectively.

With respect to the MBE parameters for the growth of the layers disclosed herein, in the example of CaS, the inventors have determined the optimized growth conditions for CaS thin films by varying the flux ratio of Ca and ZnS as well as the substrate temperature. In accordance with embodiments disclosed herein, the optimized source temperatures of elemental Ca and ZnS are 430° C. and 910° C., respectively. In the example of CaTe, the inventors have determined the optimized source temperatures of elemental Ca and Te are 485° C. and 290° C., respectively.

In embodiments disclosed herein, the thickness of the precursory layer is such that the layer is continuous, but thin enough to adjust the crystalline structure at the second temperature discussed below. The thickness of the precursory layer may be as thin as 2-3 nm, and as thick at 10 nm.

The first temperature is selected to be high enough for reliable deposition, by low enough not to damage the sample. The first temperature may vary as much as ±30° C. in accordance with embodiments disclosed herein. For example, in the binary molecular precursor layer using CaS, the thickness of the precursory layer is 5 nm. In such embodiments, the first temperature is 180° C. As another example, in the binary molecular precursor layer using CaTe, thickness of the precursor layer is the same as in CaS, and the first temperature is 200° C.

In ST 204 of FIG. 2, the temperature of the substrate is ramped up at a first rate to a second temperature under the flux of the molecular beam epitaxy. The first rate is set to ensure that the growth be unimpeded by the changing temperature. The first rate, may vary as much as ±20° C./min in accordance with embodiments disclosed herein. The second temperature is selected to be high enough to improve the crystalline quality of the seed layer, but low enough prevent, the evaporation of the seed layer. The second temperature may vary as much as ±30° C. in accordance with embodiments disclosed herein. For example, in the CaS embodiments, the first rate is +50° C./min and the second temperature is 550° C. In the CaTe embodiments, the first rate is +50° C./min and the second temperature is 300° C. As disclosed, ST 204 occurs under the flux of the molecular beam epitaxy. In other words, the layer is continuing to form during this step. During this step, the RHEED patterns gradually improve towards the desired rocksalt crystalline structure.

In ST 206, the temperature of the substrate is held at the second temperature for a first period of time while under the flux of the molecular beam epitaxy. The first period of time may be determined based on a measured RHEED pattern. The RHEED patterns gradually become bright streaks without any observable features of defects. For example, one or more embodiments disclosed herein use a period of time of 30 minutes.

Then, in ST 208, the temperature of the substrate is reduced at a second rate to a third temperature while under the flux of the molecular beam epitaxy. The second rate is selected to ensure that the growth be unimpeded by the changing temperature, while maintain the crystalline structure. The second rate may vary as much as ±10° C./min in accordance with embodiments discussed herein. The third temperature is limited to maintain a relatively fast growth rate. The third temperature may vary as much as ±30° C. in accordance with embodiments herein. For example, in the one or more of the CaS embodiments, the second rate is −30° C./min and the third temperature is 350° C. In one or more of the CaTe embodiments disclosed herein, the second, rate is −30° C./min and the third temperature is 230° C., During the temperature lowering process, the RHEED patterns remained bright and streaky without any observable features of defects.

In ST 210, a second layer is formed of the same binary molecular material as the precursor layer, on the binary molecular precursor layer for a second period of time to form an active layer. In other words, the binary molecular precursor layer is continued to be grown for a second period of time to form the final binary molecular active layer. The second period of time may be determined based on a desired thickness of formed active layer or to avoid an unwanted effect on the photoresponse performance from the interfacial layer. For example, in one or more embodiments disclosed herein, the second period of time is 30 minutes. The RHEED patterns show no sign of deterioration in this step. In this step, the RHEED pattern is used to monitor whether the high quality of the active layer is maintained at the third temperature.

One of ordinary skill in the art will recognize that the above ST 202-ST 210 may be used in many applications that may benefit from the formation of such a crystalline layer. As disclosed, steps ST 202-ST 210 may be used to form Schottky-barrier diodes, UV solar blind detectors, quantum well structures and topological crystalline insulators.

One of ordinary skill in the art will now recognize that the above techniques may be combined with known techniques to form various devices, such as a Schottky-barrier diode or quantum well structure. For example, the fabrication of CaTe/SnTe/CaTe quantum well structures may be performed by the growth of the bottom CaTe layer using the precursor layer growth approach above followed by conventional growths of the SnTe quantum well and the CaTe cap layer.

Steps ST 212-ST 216 describe steps for fabricating a Schottky-barrier diode from the deposited active layer 104 on to the substrate 102 in accordance with embodiments herein. In ST 212, a semi-transparent conducting layer is deposited on the active binary molecular layer. For example, as disclosed above, the semi-transparent metal layer may be a layer of Au with thickness of 10 nm. In the examples disclosed herein, the semi-transparent conducting layer was deposited using a Denton Desk II sputtering system.

In ST 214, an electrical contact is disposed on the opposite side of the substrate, i.e., the opposite side of the substrate with respect to the side where the active layer and conducting layer are formed. For example, as disclosed above, ohmic contacts may be disposed on the back side of the GaAs substrates using molten gallium as known in the art. In ST 216, the substrate is electrically connected via the electrical contact to the semi-transparent conducting layer to a circuit. For example, the circuit may include a voltmeter to measure the response of the Schottky-barrier diode, and hence, the photoresponse of the UV solar blind detector.

Table 1 below demonstrates properties of several examples in accordance with one or more embodiments disclosed herein. The examples of the Schottky-barrier diode based UV solar blind detectors in Table 1 use a CaS active layer on epi-ready $n^+$-GaAs(100) substrate; a semi-transparent metal layer of Au with thickness of 10 nm; and ohmic contacts formed using molten gallium. In the MBE process, the optimized source temperatures of elemental Ca and ZnS were 430° C. and 910° C., respectively.

TABLE 1

| Sample | Growth temperature (° C.) | First Temperature (° C.) | Second Temperature (° C.) | Third Temperature (° C.) | Thickness of Active layer (nm) |
|---|---|---|---|---|---|
| A | 260 | — | — | — | 15 |
| B1 | — | 180 | 550 | 350 | 50 |
| B2 | — | 180 | 550 | 360 | n/a |
| B3 | — | 180 | 550 | 340 | n/a |
| C | — | 180 | 550 | n/a | n/a |

Sample A of Table 1 demonstrates a conventional deposition process where the CaS layer was grown using MBE at a set temperature of 260° C. In other words, for Sample A the temperature of the substrate was set to 260° C., and the MBE process was allowed to proceed to form the CaS layer. In the initial stage of the growth, the RHEED pattern gradually changes from blur thick streaks to long narrow streaks with faint on-streak spots. Sample A was prepared using a conventional deposition process to a thickness of about 15 nm, without showing any offline spots in its RHEED pattern. However, it is important to note that when the thickness of the conventionally grown thin film reaches a critical value of about 20 nm, the RHEED patterns start to show off-streak spots and short arcs. The RHEED patterns then gradually turn to a very spotty pattern with long arcs. The structural transition as monitored using the RHEED pattern described above indicates that a conventional growth approach may only result in CaS thin films with barely satisfactory crystalline quality up to a limited thickness (~20 nm).

Samples B1, B2, and B3 of Table 1 use the method described in FIG. 2 in accordance with embodiments disclosed herein. Specifically, for Samples B1, B2, and B3, the first temperature is 180° C., the first rate is +50° C./min, the second temperature is 550° C., the first period of time is 30 minutes, the second period of time is 30 minutes, and the second rate is −30° C./min. Sample B1 has a third temperature of 350° C. The thickness of the active CaS layer in Sample B1 was determined to be ~50 nm by cross sectional scanning electron microscope imaging. This thickness far exceeds the critical thickness of 20 nm for the conventional growth methods mentioned above.

Samples B2 and B3 were prepared using the same method as Sample B1, except the substrate temperatures for the last stages of their layer growths (third temperature) where +10° C. and −10° C. for Sample B2 and B3, respectively. In other words, the third temperature of Samples B2 and B3 is 360° C. and 340° C., respectively.

Sample C of Table 1 was prepared to study the structural quality of the CaS precursor layer by investigating the photoresponse curve of a Schottky-barrier diode formed using only the CaS precursor layer. In Sample C, the growth process was terminated at the conclusion of ST 206 described above, and the semi-transparent conducting layer, ohmic contacts, and electrical connections are formed as in steps ST 212-ST 216.

Figure 3A:
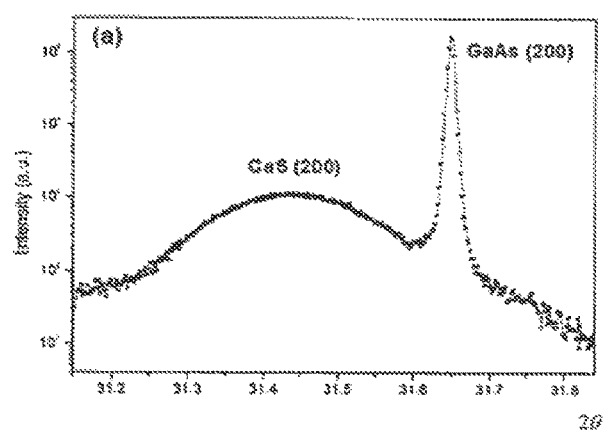
FIGS. 3A and 3B are graphs in accordance with one or more embodiments of the invention.
Figure 3B:
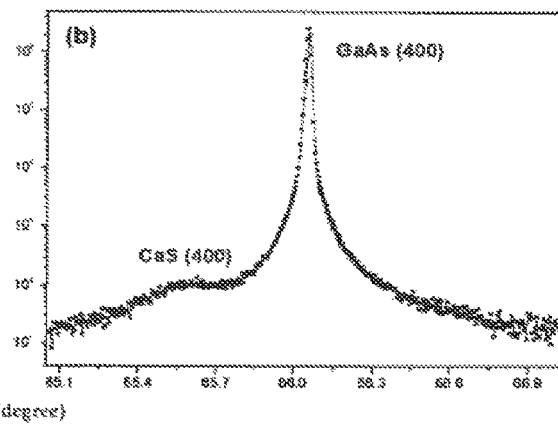

FIGS. 3A and 3B are High Resolution X-ray Diffraction (HRXRD) scans of Sample B1 in accordance with one or more embodiments discussed herein. The HRXRD scans were performed using a PANalytical Empyrean multi-purpose XRD on the as-grown samples of the CaS active layer, prior to the addition of the semi-transparent conducting layer. FIGS. 3A and 3B demonstrate that the as-grown samples of die CaS active layer of Sample B1 are clearly in a rocksalt phase. In FIGS. 3A and 3B, one can see that the CaS (200) peak (FIG. 3A) and CaS (400) peak (FIG. 3B) locate at 2θ of 31.44° and 65.57°, respectively. These values match those from a powder diffraction database for rocksalt CaS, which are 31.406° and 65.504° for the (200) and (400) peaks, respectively. The deduced lattice constant of the resulting CaS active layer of Sample B1 according to Bragg's law is 5.69 Å, which exactly matches the value of a bulk rocksalt-phase CaS.

As further evidence that the active layer in a rocksalt phase, the peak intensity ratio of CaS (200) to CaS (400) is larger than 1, while that of GaAs (200) to GaAs (400) is smaller than 1. This contrast matches that of powder diffraction database values for rocksalt CaS and zinc-blende GaAs.

Figure 4A:
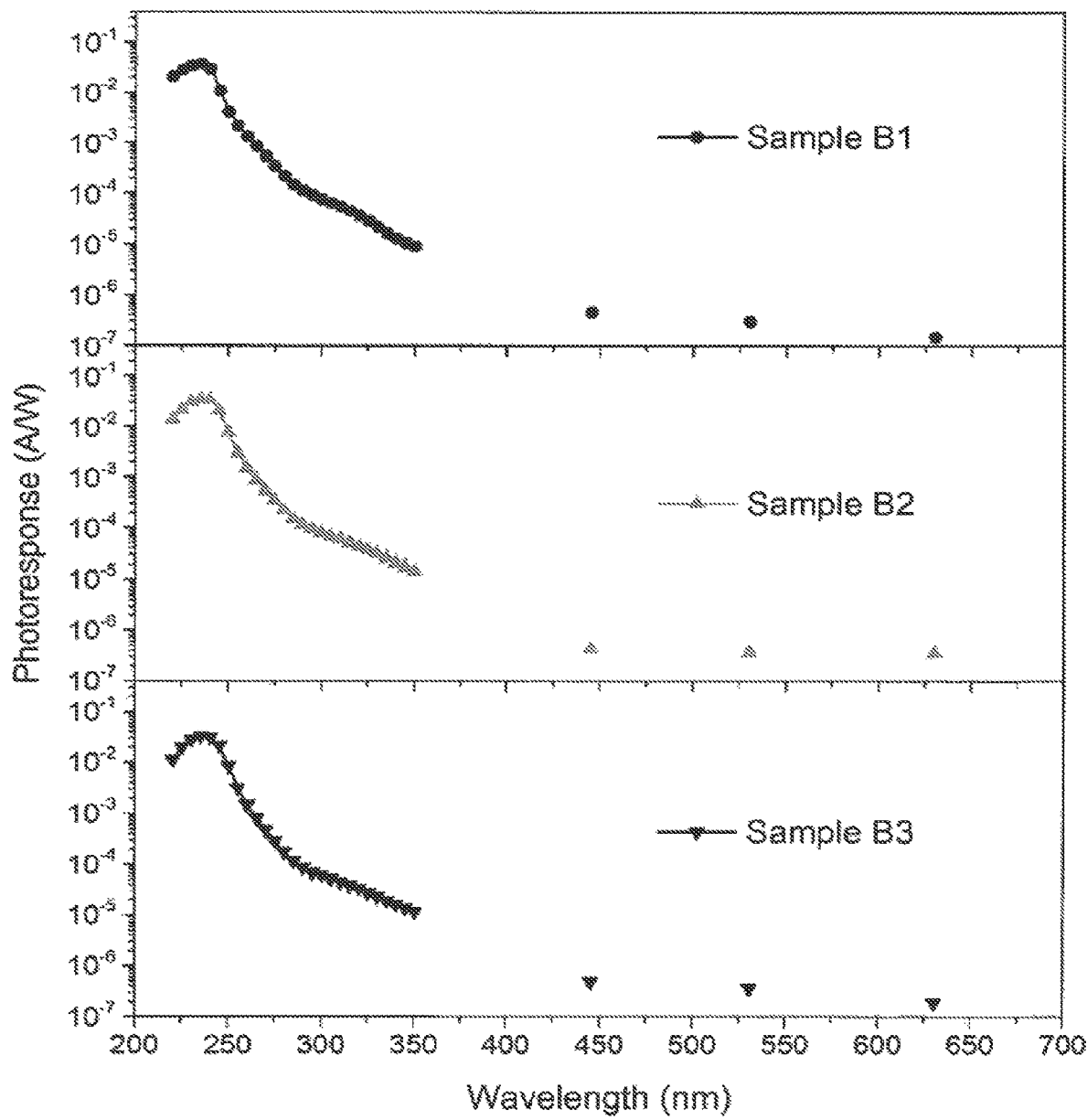
FIG. 4A is a graph of the photoresponse in accordance with one or more embodiments of the invention.
Figure 4B:
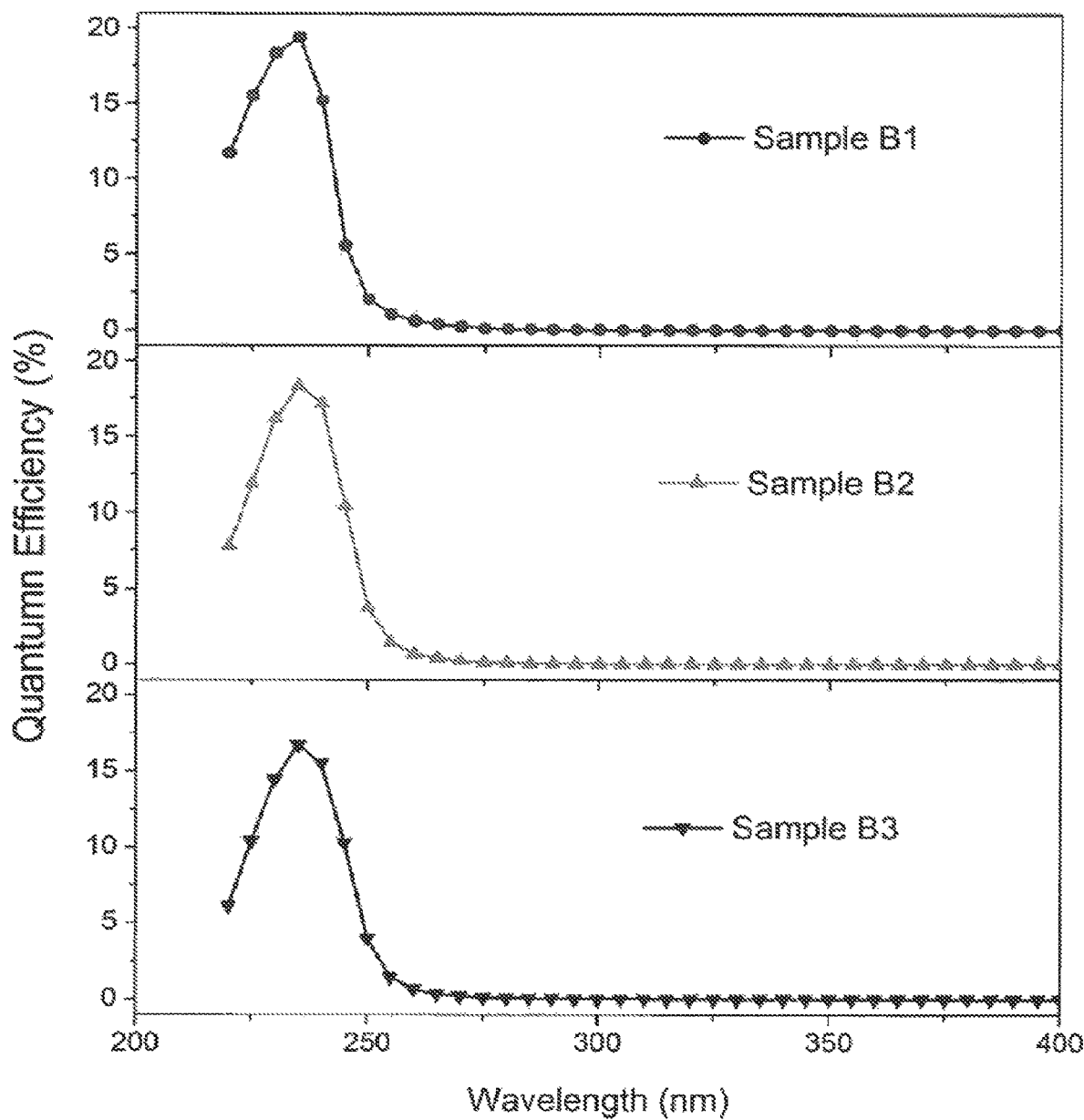
FIG. 4B is a graph of the external quantum efficiency in accordance with one or more embodiments of the invention.

FIGS. 4A and 4B demonstrate the photoresponse and external quantum efficiency, respectively, of the Samples B1, B2, and B3 in accordance with embodiments disclosed herein.

The photoresponse of the samples in Table 1 was measured using a setup consisting of a 150 W xenon arc lamp as light source, an Acton SP-2155 monochromator, and a Newport 818UV UV-enhanced Si photodiode connected to Keithley 237 digital current meter. Due to the high visible rejection of the devices, the photocurrent in visible region was not measurable because the output light from the monochromator was not strong enough. Therefore, in FIGS. 4A and 5A, lasers with wavelengths of 445, 530, and 630 nm were used to provide the photoresponses in the visible region.

As shown in FIG. 4A, Samples B1, B2, and B3, display sharp cut-off at 235 nm with rejection of more than three orders at 350 nm and more than five orders at 630 nm in accordance with embodiments herein. The similarity in the photoresponse of Samples B1, B2, and B3 demonstrate that the reproducibility of the quality of CaS layers may be achieved regardless of slight variations in the substrate temperatures used in the last stage of the growth approach in accordance with embodiments disclosed herein.

Figure 5A:
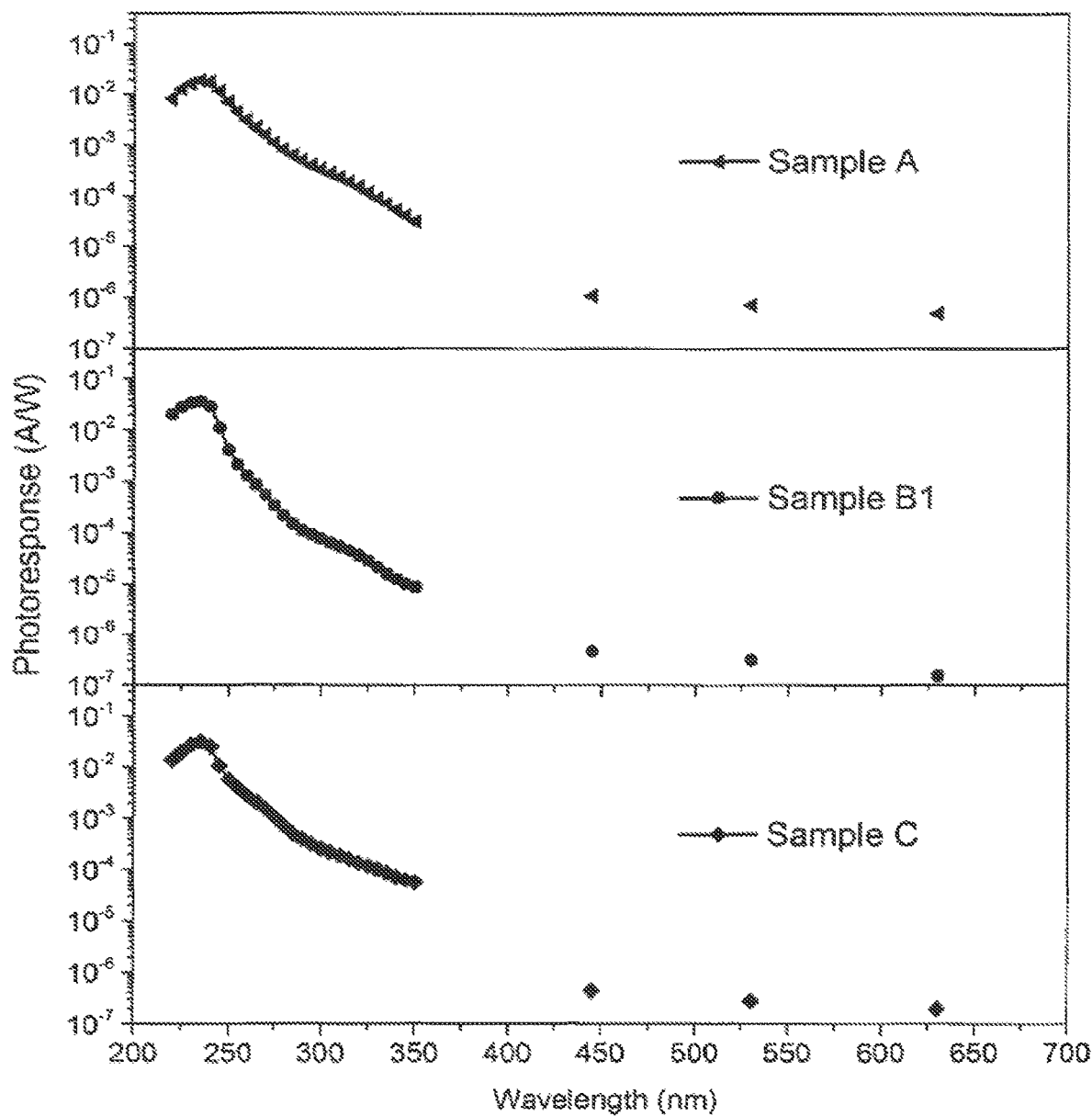
FIG. 5A is a graph of the photoresponse in accordance with one or more embodiments of the invention.
Figure 5B:
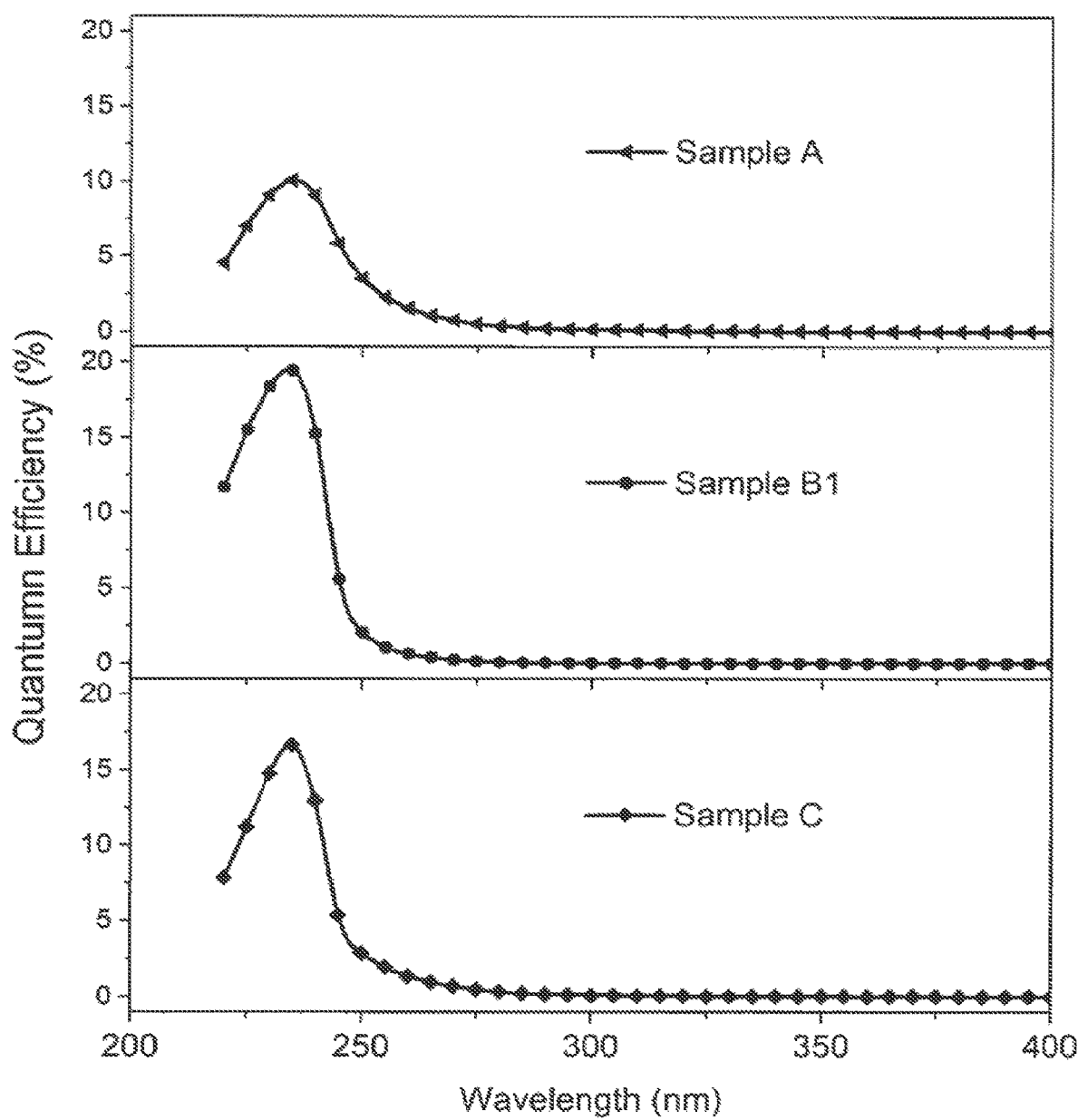
FIG. 5B is a graph of the external quantum efficiency in accordance with one or more embodiments of the invention.

The external quantum efficiencies shown in FIGS. 4B and 5B were calculated, using a standard expression of $\eta = I_{sc} hc/Pe\lambda$, where $I_{sc}$ is the short-circuit photocurrent, h the Plank's constant, c the speed of light, e the electron charge, λ the wavelength of the incident photons, and P the power of photons at wavelength λ incident on the active area of the photodiode.

The external quantum efficiencies of Samples B1, B2, and B3 peak at 235 nm with values of around 17-19% as shown in FIG. 4B.

FIGS. 5A and 5B demonstrate the photoresponse and external quantum efficiency, respectively, of the Samples A, B1, and C in accordance with embodiments disclosed herein. As can be seen from FIG. 5B, the photoresponse curve of Sample A using the conventional process shows significantly lower external quantum efficiency. Further, FIG. 5A demonstrates a much lower rejection power around 250 nm and above, for Sample A. This indicates that the precursor layer growth approach of FIG. 2 may result in CaS layers of much higher quality than what the conventional growth approach can achieve, which is in agreement with the RHEED observations.

FIGS. 5A and 5B also show the photoresponse and external quantum efficiency of Sample C, which is a sample that utilizes only the precursor layer of CaS in the Schottky-barrier diode. Recall, Sample C was prepared using the precursor layer growth approach of FIG. 2 with the growth ended right after the sample was held at the 550° C. for about 30 minutes until the RHEED patterns turned to bright streaks without any observable features of defects (ST 208).

As can be seen in FIG. 5B, the peak external quantum efficiency and the visible rejection power of Sample C are comparable to those of Sample B1. However, as shown in FIG. 5A, Sample C shows a more gradual cutoff and a much lower rejection power around 250 nm to at least 350 nm. The contrast between Sample C and B1 demonstrates that a complete active layer (Sample B1) has an upper portion with high crystalline quality. However, the CaS precursor layer (Sample C) may still contain crystalline imperfections that contribute defect states within the energy bandgap, leading to a relatively higher photoresponse from 250 nm to at least 350 nm.

In addition to the above, the applicants have recently developed a binary compound type of solar-blind UV detector using MgS as the active layer. However, MgS reacts with water vapor present in the air. The water vapor reaction may cause detectable deterioration in the layer within a few hours. Such considerations may cause challenges in downstream microelectronic processing. Although some of these considerations may be overcome by quickly applying a dry-microelectronic process and encapsulation with a suitable epoxy, the improved embodiments of the solar-blind UV detector disclosed herein use CaS. CaS only slightly reacts with water vapor in air. Therefore, embodiments of the CaS active layer show no detectable deterioration within a week, providing enough time for handling the downstream microelectronic processing.

It should be understood by those having ordinary skill that the present invention shall not be limited to specific examples depicted in the figures and described in the specification. As such, various mechanisms may be used to create many more examples without departing from the scope of the present invention. While the present invention has been described with respect to a limited number of embodiments, those skilled in the art, having benefit of this disclosure, will appreciate that other embodiments may be devised which do not depart from the scope of the invention as described herein. Accordingly, the scope of the invention should be limited only by the attached claims.

What is claimed is:

1. A UV radiation detector comprising:
   a Schottky-barrier diode, the Schottky-barrier diode comprising:
   a substrate having a first side and a second side, the first side and the second side being located on opposing faces of the substrate;
   a calcium sulfide (CaS) rocksalt phase crystalline layer as an active material grown on the first side of the substrate;
   an electrical contact disposed on the second side of the substrate; and
   a semi-transparent conducting layer disposed on the CaS rocksalt phase crystalline layer; and
   a circuit connecting the semi-transparent conducting layer and the electrical contact,
   wherein the UV radiation detector detects radiation having a wavelength between 200 and 280 nm,
   wherein the Schottky-barrier diode has an external quantum efficiency of at least 19% at a wavelength of 235 nm when operated in zero-bias mode.

2. The UV radiation detector according to claim 1, wherein the substrate has a lattice constant of 5.69 Å.

3. The UV radiation detector according to claim 1, wherein the CaS rocksalt phase crystalline layer is between 20-50 nm thick.

4. The UV radiation detector according to claim 1, wherein the substrate is an $n^+$-GaAs substrate.

5. The UV radiation detector according to claim 1, wherein the semi-transparent conducting layer is a 10 nm thick layer of gold.

* * * * *